US007305346B2

(12) United States Patent
Oyama et al.

(10) Patent No.: US 7,305,346 B2
(45) Date of Patent: Dec. 4, 2007

(54) AUDIO PROCESSING METHOD AND AUDIO PROCESSING APPARATUS

(75) Inventors: Tatsushi Oyama, Ogaki (JP); Hideki Yamauchi, Oogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 968 days.

(21) Appl. No.: 10/390,624

(22) Filed: Mar. 19, 2003

(65) Prior Publication Data

US 2003/0182134 A1 Sep. 25, 2003

(30) Foreign Application Priority Data

Mar. 19, 2002 (JP) ............................ 2002-077209

(51) Int. Cl.
*G10L 21/00* (2006.01)
*H03G 3/00* (2006.01)

(52) U.S. Cl. ...................... 704/503; 381/104; 381/106; 381/107

(58) Field of Classification Search ................ 704/200, 704/200.1, 225, 230, 500–501, 503; 375/240; 381/102, 104, 106–107; 341/139
See application file for complete search history.

(56) References Cited

U.S. PATENT DOCUMENTS

| | | | | |
|---|---|---|---|---|
| 5,204,677 | A * | 4/1993 | Akagiri et al. | 341/118 |
| 5,454,011 | A * | 9/1995 | Shimoyoshi | 375/240 |
| 5,699,479 | A * | 12/1997 | Allen et al. | 704/205 |
| 5,731,767 | A * | 3/1998 | Tsutsui et al. | 341/50 |
| 5,754,973 | A * | 5/1998 | Akune | 704/205 |
| 5,825,320 | A * | 10/1998 | Miyamori et al. | 341/139 |
| 6,041,295 | A * | 3/2000 | Hinderks | 704/206 |
| 2003/0091180 | A1* | 5/2003 | Sorqvist et al. | 379/390.03 |

FOREIGN PATENT DOCUMENTS

| | | |
|---|---|---|
| JP | 06-164414 | 6/1994 |
| JP | 9-510837 | 10/1997 |
| JP | 10-97296 | 4/1998 |
| WO | WO 95/17049 | 6/1995 |

OTHER PUBLICATIONS

Lam et al, "Perceptual Suppression of Quantization Noise in Low Bitrate Audio Coding", Asilomar Conference on Signals, Systems and Computers, Monterey, CA, 1997, pp. 49-53.*
Chinese Office Action issued Jul. 15, 2005, Chinese Patent Application No. 03107642.4, filed on Mar. 19, 2003.
Foreign Office Action for Corresponding Japanese Patent Application No. 2002-077209 (w/English Translation) Reference No. NBC1022051 Dispatch No. 329789 Dispatch Date: Sep. 6, 2005 Patent Application No. 2002-077209 Drafting Date: Aug. 31, 2005 Examiner of JPO: Tsuyoshi Yamashita 8946 5Z00 Representative/ Applicant: Sakaki Morishita.

* cited by examiner

*Primary Examiner*—Patrick N. Edouard
*Assistant Examiner*—James S. Wozniak
(74) *Attorney, Agent, or Firm*—McDermott Will & Emery LLP

(57) ABSTRACT

A volume adjustment unit reduces the volume of audio data. By coding the audio data where the volume is reduced in advance, the possibility of being decoded in a manner of exceeding the maximum bit number at a reproduction-side apparatus is reduced. Thus, the volume adjustment unit needs to reduce the volume of the audio data during a processing at a data input unit up to a quantization coding unit, that is, before the end of quantizing, based on a compression ratio.

8 Claims, 3 Drawing Sheets

FIG. 1

| | sam1 | sam2 | sam3 | sam4 | sam5 |
|---|---|---|---|---|---|
| FREQUENCY BAND (kHz) AT COMPRESSION | 8 | 8 | 8 | 8 | 8 |
| THE NUMBER OF CLIPPING AT EXPANSION | 10 | 8 | 15 | 0 | 0 |
| OCCURRENCE OF NOISE AT REPRODUCTION | YES | YES | YES | NO | NO |

FIG. 2

| | sam6 | sam7 | sam8 | sam9 | sam10 |
|---|---|---|---|---|---|
| FREQUENCY BAND (kHz) AT COMPRESSION | 8 | 9 | 10 | 11 | 17 |
| THE NUMBER OF CLIPPING AT EXPANSION | 10 | 10 | 10 | 12 | 32 |
| OCCURRENCE OF NOISE AT REPRODUCTION | YES | YES | YES | NO | NO |

AUDIO PROCESSING METHOD AND AUDIO PROCESSING APPARATUS

BACKGROUND OF THE INVENTION

1. Field of the Invention

The present invention relates to method and apparatus for processing audio data, and it particularly relates to a technology by which to reduce the noise of the audio data at the time of reproduction thereof.

2. Description of the Related Art

In recent years the coding of digital audio data at high compression ratios has been a subject of intense research and development and the area of its applications is expanding. With the broadened use of portable audio reproducing devices in particular, it is now a general practice that linear PCM signals recorded on, for example, a CD (compact disk) are compressed and recorded on such recording media as small semiconductor memory or minidisk. Also, in modern society where information abounds, data compression technology is indispensable and it is desirable that recording capacity be saved by compressing data to be recorded even on such large-capacity recording media as HD (hard disk), CD-R or DVD. And this compression coding is done by utilizing the most of various technologies including screening of unnecessary signals according to human auditory characteristics, optimization of the assignment of quantized bits, and Huffman coding. Techniques for audio data compression with higher audio quality and higher compression ratios are being studied daily as a most important subject in this field.

In the reproduction of compressed data, the higher the compression ratio is, the greater the quantization error will be, and as a result, there are cases where the reproduced audio data exceeds the original dynamic range of audio data. For example, when 16-bit PCM signals are compressed at a high compression ratio and then decompressed or expanded, there may be instances where expanded data exceeds 16 bits in computation. In such a case, a technique called clipping has conventionally been used, whereby data in excess of 16 bits are substituted into maximum values represented in 16 bits.

At compression ratios required in the conventional practices, there have been few cases where the effect of clipping could be aurally detectable. However, at high compression ratios required today, noises offensive to the ear can often occur as a result of clipping due to the quantization error which is far greater than before. With the compression ratio further rising in the future, this noise problem is expected to grow. Hence, it is believed that clipping by apparatus on the reproduction side only may not suffice to deal with this problem adequately. Described in the following are the experimental data in an analysis of a relationship between clipping and noise.

FIG. 1 shows a relationship between the number of clippings and the presence or absence of noise when audio data are compressed under a fixed compression condition and then expanded and reproduced by a reproduction apparatus. These are the results of an experiment in which 500,000 samples×2 channels were prepared as sound sources. As shown in FIG. 1, sam1 to sam3 are experimental data where audio data from sound sources at high volume were compressed and sam4 and sam5 are experimental data where audio data from sound sources at low volume were compressed. As for the number of clippings, nine consecutive clippings were counted as one count. As is evident in the table, clippings occurred and noise also occurred at reproduction with sam1 to sam3 whereas neither clippings nor noise occurred with sam4 and sam5. This experimental result indicates that under the same compression conditions the higher the volume of sound source, the more likely clippings and noise will occur.

FIG. 2 shows a relationship between the number of clippings and the presence or absence of noise when 500,000 samples×2 channels were prepared as sound sources likely to cause clippings as used with sam1 to sam3 in FIG. 1 and the audio data were compressed under different compression conditions and then expanded and reproduced by a reproduction apparatus. As for the count of clippings, nine consecutive clippings were here counted as one. The frequency bands at compression are those narrowed as a result of compression, indicating that the smaller the value, the higher the compression ratio is. Compression was done in such a way as to remove high-frequency components of data that has been time-frequency converted. For example, the frequency band of 8 kHz of sam6 is to be understood as a frequency band of 0 to 8 kHz after the removal of the high-frequency components above 8 kHz.

The table shows that clippings occurred with all of sam6 to sam10 while noise occurred with sam6 to sam8 but not with sam9 and sam10. Therefore, this experimental result indicates that the occurrence of noise depends on the frequency band secured at compression rather than on the count of clippings.

FIG. 3 shows frequency spectra at reproduction when a sound source of 5 kHz sinusoidal wave is used. The results of this experiment show that there are noise components occurring at 1 kHz and 9 kHz. It is to be noted here that noise components at 15 kHz and above are substantially inaudible to the human ear. It is believed therefore that when there are no audios in the neighborhood of 9 kHz at the reproduction of audio data, the noise component at 9 kHz caused by this 5 kHz sinusoidal wave is detected as a noise offensive to the ear. For example, with sam6 in FIG. 2 wherein compression is done in the frequency band of 0 to 8 kHz, the noise component at 1 kHz may be concealed behind other sounds, but the noise component at 9 kHz can be heard by human ears. The inventors of the present invention consider that one of the reasons for the occurrence of noise as seen in the experimental results of FIG. 2 is the failure to conceal the noise components by other sounds by removing the high-frequency components of the audio data and narrowing the frequency band at compression.

SUMMARY OF THE INVENTION

Based on the knowledge obtained through the experiments as described above, the inventors conceived of a novel method for compressing audio data in such a manner as to reduce noise of reproduced signals. An object of the present invention is, therefore, to provide method and apparatus for processing audio data, which can solve the above-described problems.

According to a preferred embodiment of the present invention, there is provided, in order to solve the above-described problems and achieve the objects, an audio processing method which includes: inputting audio data in which the magnitude of volume is expressed by the magnitude of data values; and quantizing the inputted audio data, wherein after the volume is reduced at a predetermined stage of said inputting audio data or quantizing the inputted audio data, a subsequent processing is continued. According to the audio processing method of this preferred embodiment, by lowering a volume level in advance at a stage prior to end of said quantizing it becomes possible to reduce possibility that the quantized audio data is decoded in a manner of exceeding a maximum bit number at expansion. A processing of lowering the volume level may be achieved by making data values small. The audio data means sound data such as musical sound and voice.

According to another preferred embodiment of the present invention, there is provided an audio processing apparatus which includes: an input unit which inputs audio data where the magnitude of volume is expressed by the magnitude of data values; a conversion unit which time-frequency transforms the inputted audio data; a quantization coding unit which quantizes frequency-expressed audio data and codes the quantized audio data; and a volume adjustment unit which reduces the volume at a predetermined stage of a processing by the input unit, the conversion unit or the quantization coding unit. According to the audio processing apparatus of this preferred embodiment, by lowering a volume level in advance at a stage prior to end of quantization it becomes possible to reduce possibility that the quantized audio data is decoded in a manner of exceeding a maximum bit number at expansion. A processing of lowering the volume level may be achieved by making data values small.

It is preferable that the volume adjustment unit reduces the volume based on a condition of compression of the audio data to be realized by the audio processing apparatus. Moreover, the volume adjustment unit may reduce the volume based on a compressed frequency band. This audio processing apparatus may further include a volume detector which preliminarily detects a volume of the audio data over a predetermined section of the audio data, and the volume adjustment unit may determine a degree of volume reduction based on the volume detected by the volume detector.

It is to be noted that any arbitrary combination of the above-described structural components, and expressions changed between a method, an apparatus, a system, a recording medium and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

FIG. 1 shows a relationship between the number of clippings and the presence or absence of noise when audio data are compressed under a fixed compression condition and then decompressed and reproduced.

FIG. 2 shows a relationship between the number of clippings and the presence or absence of noise when audio data are compressed under various compression conditions and then decompressed and reproduced.

DETAILED DESCRIPTION OF THE INVENTION

The invention will now be described based on preferred embodiments which do not intend to limit the scope of the present invention but exemplify the invention. All of the features and the combinations thereof described in the embodiments are not necessarily essential to the invention.

Figure 3:
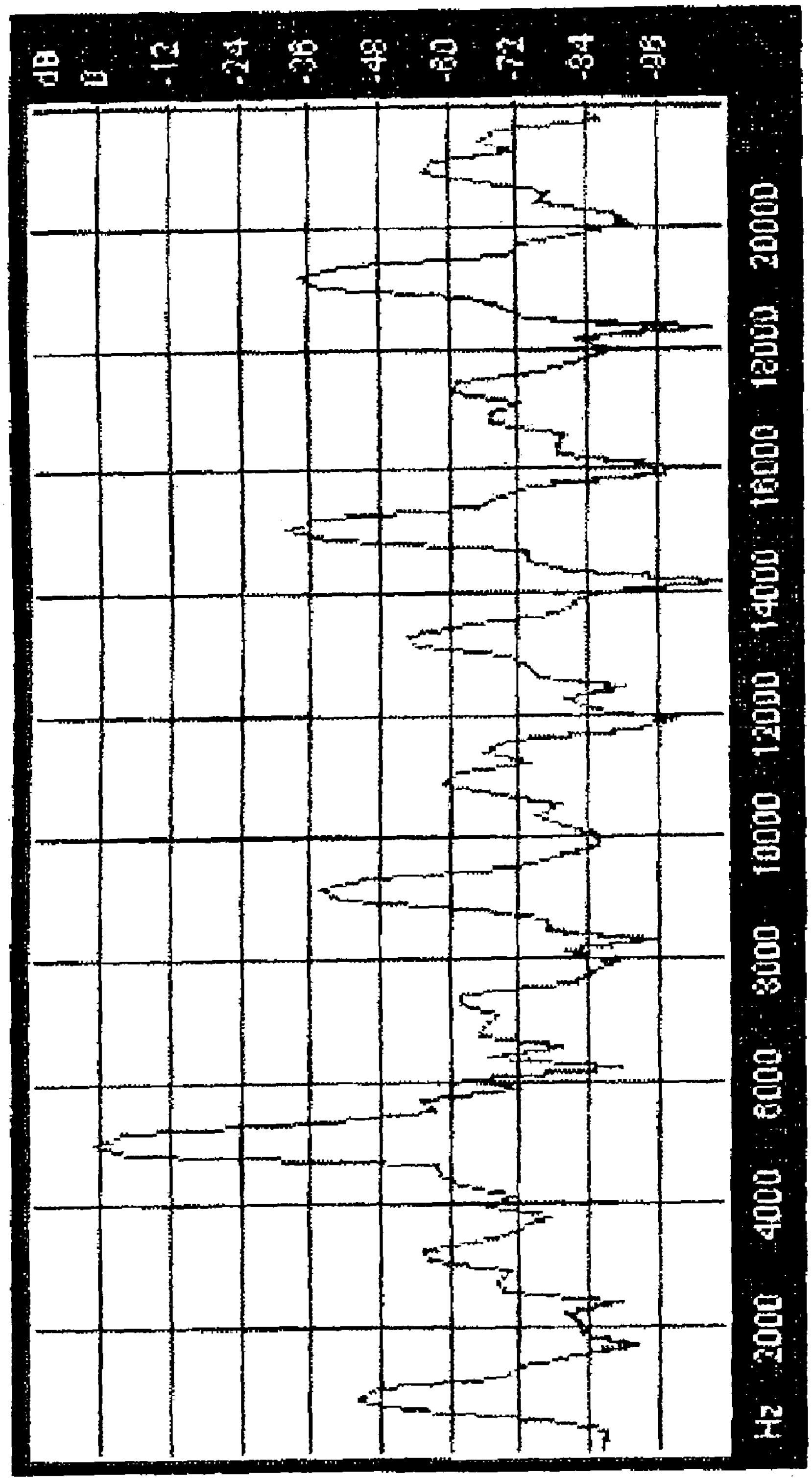
FIG. 3 shows a frequency spectrum at reproduction when a sound source is a 5 kHz sinusoidal wave.
Figure 4:
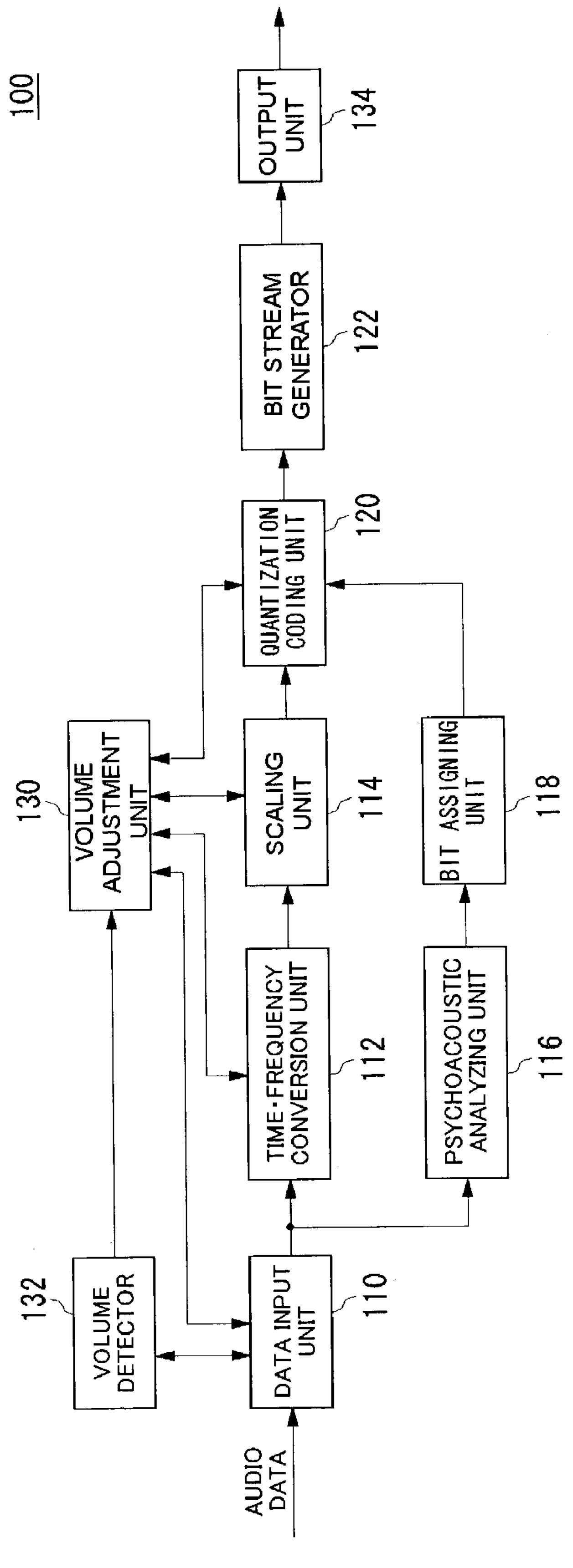
FIG. 4 shows a structure of an audio processing apparatus according to an embodiment of the present invention.

FIG. 4 shows a structure of an audio processing apparatus 100 according to a preferred embodiment of the present invention. This audio processing apparatus 100 comprises a data input unit 110, a time-frequency conversion unit 112, a scaling unit 114, a psychoacoustic analyzing unit 116, a bit assigning unit 118, a quantization coding unit 120, a bit stream generator 122, a volume adjustment unit 130, a volume detector 132, and an output unit 134. In terms of hardware components, the audio processing apparatus 100 is realized by a CPU, memory, memory-loaded programs and the like of arbitrary audio apparatuses. The description here in the preferred embodiments concerns functional blocks that are realized in cooperation with such components. The functions of the audio processing apparatus 100 in whole or in part may be fabricated into an LSI. Therefore, it should be understood by those skilled in the art that those functional blocks can be realized by a variety of forms by hardware only, software only or by the combination thereof.

First, basic operations of the audio processing apparatus 100 according to the present embodiment will be described here. Audio data are first supplied to the data input unit 110. These audio data are data values representing respective levels of sound volume. Namely, the magnitude of sound volume is expressed by the magnitude of data values. In more concrete terms, these audio data are digitized time-series signals, and for example, audio data stored on a CD are linear PCM signals having the quantization bit number of 16 bits at 44.1 kHz. The data input unit 110 may be either a buffer for temporary storage of audio data or a terminal or the like that simply receives or transfers the audio data. The data input unit 110 inputs the audio data into the audio processing apparatus 100.

The time-frequency conversion unit 112 divides the audio data into a predetermined number of subbands by subjecting them to a time-frequency transform and outputs spectrum signal components for each of the subbands. For example, the time-frequency conversion unit 112 performs a time-frequency transform on 1024 pieces of 16-bit signal, generates spectrum signals therefor, and divides these spectrum signals into 32 subbands to which predetermined bands are assigned. The time-frequency conversion unit 112 is structured by a plurality of subband filters or the like.

The scaling unit 114 scales the spectrum signal components sent from the time-frequency conversion unit 112 and calculates and fixes a scale factor for each of the subbands. Specifically speaking, the scaling unit 114 detects a maximum amplitude value of the spectrum signal component for each of the subbands and calculates a scale factor above and closest to this maximum amplitude value. This scale factor is a value corresponding to a scale factor by which audio data are normalized into original waveform at decoding, and represents a range that the quantized data can take. The scaling unit 114 supplies to the quantization coding unit 120 the spectrum frequency components after scaling and the scale factors.

The psychoacoustic analyzing unit 116 computes masking levels, which represent threshold levels for human hearing, by using a psychoacoustic model. The human sense of hearing is characterized by the fact that its audible level has a limit (minimum audible limit) depending on frequencies and moreover it has difficulty in hearing signals in the neighborhood of spectrum signal components at even higher levels (masking effect). Using the human's auditory characteristics, therefore, the psychoacoustic analyzing unit 116 computes, for each of the subbands, a masking level M indicating a limit value for auditory masking to be determined by the minimum audible limit and masking effect, and computes an SMR (signal to mask ratio) which is a ratio of signal S to masking level M.

The bit assigning unit 118 determines an amount of quantized bits to be assigned to each of the subbands, using the above-described SMR. For subbands whose spectrum frequency components are lower than the masking level, the bit assigning unit 118 selects 0 as the quantity of quantized bits to be assigned thereto.

The quantization coding unit 120 quantizes the spectrum signal components for each of the subbands, based on the scale factor supplied from the scaling unit 114 and the assigned amount of quantized bit supplied from the bit assigning unit 118. Then the quantization coding unit 120 performs a variable-length coding of the quantized data, using Huffman coding or like technique. The bit stream generator 122 turns the quantization-coded data into a bit stream, and the output unit 134 supplies this bit stream to a recording medium or the like for use with recording.

Next, portions characteristic of this embodiment will be described here. The volume adjustment unit 130 has a function of lowering the volume of audio data. These audio data may be either data, such as PCM signals, that are represented on the time axis or data that are represented on the frequency axis. By coding audio data of lowered volume, it is possible to reduce the possibility of decoding beyond the maximum number of bits at a reproduction-side apparatus and thus to reduce noise at the time of reproduction. Accordingly, it is necessary that the volume adjustment unit 130 lowers the volume of audio data at a timing preceding the end of quantization processing at the quantization coding unit 120. As described above, the audio data are supplied to the quantization coding unit 120 via the data input unit 110, the time-frequency conversion unit 112 and the scaling unit 114. Hence, the volume adjustment unit 130 lowers the volume of the audio data within the space between the data input unit 110 and the quantization coding unit 120, both inclusive.

As a first choice, the volume adjustment unit 130 may make volume adjustment directly to time-series audio data at the data input unit 110. This volume adjustment is done by multiplying the audio data by a volume adjustment coefficient which is less than 1. By reducing original audio data values, the amplitude of audio data to be coded can be made smaller.

As a second alternative, the volume adjustment unit 130 may make a volume adjustment to audio data at the time-frequency conversion unit 112. For example, since the time-frequency conversion unit 112 includes a QMF (Quadrature Mirror Filter) unit, which is a band dividing filter, and an MDCT (Modified Discrete Cosine Transform) unit, the volume adjustment unit 130 can realize the volume adjustment by adjusting the audio data supplied from the QMF unit to the MDCT unit. According to an experiment conducted by the inventors of the present invention, all the noise that occurred with sam6 to sam8 shown in FIG. 2 could be actually eliminated by multiplying the audio data by a volume adjustment coefficient of 0.8125.

As a third alternative, the volume adjustment unit 130 may adjust the value of a scale factor calculated at the scaling unit 114. Since this scale factor is used in quantization, the volume adjustment can be realized by adjusting the values of the scale factor.

As a fourth alternative, the volume adjustment unit 130 may make a volume adjustment at the time of quantization operation in the quantization coding unit 120 by multiplying the audio data by a volume adjustment coefficient which is less than 1. A volume adjustment can therefore be realized by directly making the quantization data smaller.

Conditions for compression, such as the compression ratio to be realized by the audio processing apparatus 100, are set for audio data to be inputted, and it is desirable that the volume adjusting unit 130 lower the volume thereof based on these compression conditions. The volume adjustment unit 130 can acquire the frequency band at compression and the volume of audio data from the compression condition. Referring back to FIG. 2, the noise occurs at reproduction when the compressed frequency band is 10 kHz or below, and the noise does not occur at reproduction when it is 11 kHz or above. Hence, when the compressed frequency band is 10 kHz or below, the volume adjustment unit 130 may, for instance, carry out volume adjustment by using a volume adjustment coefficient of less than 1. On the other hand, when the compressed frequency band is 11 kHz or above, no volume adjustment of the audio data is required. These conditions and characteristics concerning compression may be recorded in a table. In this manner, an effective volume adjustment can be realized by utilizing the compressed frequency band.

The volume detector 132 preliminarily detects the volume of audio data for a predetermined section of the data. For example, when audio data are supplied from a CD, the audio data, whose levels are likely to require the clipping processing, are detected by conducting a high-speed parsing over a part or the whole of the audio data contained in the CD. Without audio data whose volume is not large enough to require clipping, it is not necessary to lower the volume thereof, so that the absence of such data is reported to the volume adjustment unit 130. Upon receipt of this report, the volume adjustment unit 130 stops its volume adjusting function, and, when necessary, may preserve the original values of audio data by outputting 1 as the volume adjustment coefficient.

On the other hand, in a case when there is audio data at a reproduction-side apparatus whose volume is likely to require the clipping processing, the volume adjustment unit 130 receives the detection result from the volume detector 132 and sets a volume adjustment coefficient corresponding to the volume thus detected. In this manner, with the volume detector 132 detecting the volume before carrying out quantization, it is possible to realize an effective volume adjustment wherein the volume adjustment unit 130 sets an optimum volume adjustment coefficient prior to volume adjustment.

The present invention has been described based on some embodiments which are only exemplary, but the technical scope of the present invention is not limited to the scope described in the those embodiments. It is understood by those skilled in the art that there exist other various modifications to the combination of each component and process described above and that such modifications are encompassed by the scope of the present invention.

Although the present invention has been described by way of exemplary embodiments, it should be understood that many changes and substitutions may further be made by those skilled in the art without departing from the scope of the present invention which is defined by the appended claims.

What is claimed is:

1. An audio processing method, including:

a) inputting audio data in which the magnitude of volume is expressed by the magnitude of data values;

b) time-frequency transforming the inputted audio data and dividing the audio data into a predetermined number of subbands;

c) scaling the frequency-expressed audio data and calculating a scale factor for each of the subbands:

d) quantizing the frequency-expressed audio data and coding the quantized audio data, in accordance with the scale factor thus calculated; and e) at a predetermined stage of step a), step b), step c) or step d), reducing the volume based on a frequency band at compression, by referring to a relationship which holds between the number of clippings and the presence or absence of noise and which occurs when the audio data are compressed, expanded and reproduced under various compression conditions.

2. An audio processing apparatus, including:

an input unit which inputs audio data where the magnitude of volume is expressed by the magnitude of data values;

a conversion unit which time-frequency transforms the inputted audio data and divides the audio data into a predetermined number, of subbands;

a scaling unit which scales the frequency-expressed audio data and calculates a scale factor for each of the subbands;

a quantization coding unit which quantizes frequency-expressed audio data and codes the quantized audio data, in accordance with the scale factor thus calculated; and volume adjustment unit which reduces the volume at a predetermined stage of a processing by said input unit, said conversion unit, said scaling unit or said quantization coding unit by referring to a relationship which holds between the number of clippings and the presence or absence of noise and which occurs when the audio data are compressed, expanded and reproduced under various compression conditions.

3. An audio processing apparatus according to claim 2, said volume adjustment unit reduces the volume by using a volume adjustment coefficient which is less than 1 if the compressed frequency band is 10 kHz or less.

4. An audio processing apparatus according to claim 3, wherein said volume adjustment does not reduce the volume if the compressed frequency band is 11 kHz or above.

5. An audio processing apparatus according to claim 2, further including a volume detector which preliminarily detects a volume of the audio data over a predetermined section of the audio data, wherein said volume adjustment unit determines a degree of volume reduction based on the volume detected by said volume detector.

6. An audio processing apparatus according to claim 2, wherein said volume adjustment unit reduces a volume of time-series audio data in said input unit.

7. An audio processing apparatus according to claim 2, wherein said conversion unit includes a band dividing filter and a discrete cosine transform unit, wherein said volume adjustment unit reduces a volume of audio data supplied to the discrete cosine transform unit from the band dividing filter.

8. An audio processing apparatus according to claim 2, wherein said volume adjustment unit reduces a volume of audio data by multiplying an audio adjustment coefficient, which is less than 1, by the audio data, in said quantization coding unit.

* * * * *